(12) United States Patent
Zuniga-Ortiz et al.

(10) Patent No.: US 6,914,332 B2
(45) Date of Patent: Jul. 5, 2005

(54) FLIP-CHIP WITHOUT BUMPS AND POLYMER FOR BOARD ASSEMBLY

(75) Inventors: Edgar R. Zuniga-Ortiz, McKinney, TX (US); Sreenivasan K. Koduri, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/057,138

(22) Filed: Jan. 25, 2002

(65) Prior Publication Data

US 2003/0141593 A1 Jul. 31, 2003

(51) Int. Cl.⁷ ................................................ H01I 23/48
(52) U.S. Cl. ........................ 257/737; 257/738; 257/780
(58) Field of Search ............................... 257/737–738, 257/780

(56) References Cited

U.S. PATENT DOCUMENTS

| | | | | |
|---|---|---|---|---|
| 5,053,851 A | * | 10/1991 | Berndlmaier et al. ....... | 257/786 |
| 5,693,565 A | * | 12/1997 | Camilletti et al. ............ | 438/17 |
| 5,943,597 A | * | 8/1999 | Kleffner et al. ............. | 438/613 |
| 6,287,893 B1 | * | 9/2001 | Elenius et al. .............. | 438/108 |
| 6,426,281 B1 | * | 7/2002 | Lin et al. ..................... | 438/612 |
| 6,426,556 B1 | * | 7/2002 | Lin ............................. | 257/738 |
| 6,605,524 B1 | * | 8/2003 | Fan et al. ................... | 438/613 |

* cited by examiner

Primary Examiner—Luan Thai
(74) Attorney, Agent, or Firm—Frederick J. Telecky, Jr.; W. James Brady, III (57) ABSTRACT

A semiconductor chip having a planar active surface including an integrated circuit protected by an inorganic overcoat; the circuit has metallization patterns including a plurality of contact pads. Each of these contact pads has an added conductive layer on the circuit metallization. This added layer has a conformal surface adjacent the chip, including peripheral portions of the overcoat, and a planar outer surface; this outer surface is suitable to form metallurgical bonds without melting. The chip contact pads may have a distribution arrayed in the center of the chip in close proximity to the chip neutral line; the distribution may leave an area portion of the active chip surface available for attaching a thermally conductive plate. The chip may further have a non-conductive adhesive layer over the overcoat, filling the spaces between the added conductive layers on each contact pad.

24 Claims, 4 Drawing Sheets

FLIP-CHIP WITHOUT BUMPS AND POLYMER FOR BOARD ASSEMBLY

FIELD OF THE INVENTION

The present invention is related in general to the field of electronic systems and semiconductor devices, and more specifically to structure and fabrication methods of wafer-scale devices without bumps and polymer layers and their assembly onto wiring boards.

DESCRIPTION OF THE RELATED ART

In their book "Chip Scale Package" (McGraw-Hill, 1999), John H. Lau and Shi-Wei Ricky Lee describe various semiconductor devices and packages of contemporary "chip-scale" families, as they are fabricated by a number of semiconductor companies worldwide. The newest designs and concepts in microelectronics assembly and packaging are aiming for a package with a planar area not substantially greater than the silicon chip itself, or at most 20% larger area. This concept, known as Chip-Scale Package (CSP), is finding particular favor with those electronics industries where the product size is continually shrinking such as cellular communications, pagers, hard disk drivers, laptop computers and medical instrumentation. Most CSP approaches are based on flip-chip assembly with solder bumps or solder balls on the exterior of the package, to interface with system or wiring boards.

A typical flip-chip process calls for solder-compatible contact pads on the circuit surface of the chip, and the deposition of solder bumps or balls thereon. The semiconductor wafers have to be separated into chips before flip-chip attachment to the board. Existing solder bump processes include solder through metal masks, electroplated solder or screen printing a mound of solder paste onto each metallic contact. Typically the solder bumps are reflowed in a chain type furnace. Alternatively, pre-fabricated solder balls may be placed on the chip pads and reflowed in a similar chain type furnace.

The chip-to-be-flipped may then be attached to a second interconnection surface such as an interposer, or alternatively, coupled directly to a printed circuit board (PCB). Attaching the flip-chip to the next interconnect is carried out by aligning the solder bumps or balls on the chip to contact pads on the second level interconnection and then performing a second solder reflow operation. During the reflow, the bumps or balls liquefy and make a bond to the next interconnect level which has pads or traces to receive the solder. Following the solder reflow step, flip-chips often use a polymeric underfill between the chip and the interposer or PCB to alleviate mechanical stress caused by the mismatch in the coefficients of thermal expansion (CTE) between the semiconductor chip, the interposer, if any, and the PCB. Many reliability problems occur due to the stress placed on the solder bumps or balls when the integrated circuit is cycled from hot to cool during operation. The interposers and underfills of the prior art are used to reduce or eliminate the mechanical stress generated by thermal cycling on the solder bumps or balls, but they help little to dissipate thermal energy.

When another set of solder balls on the opposite side of the interposer is employed to complete the bonding process to a PCB, this second set may also be aligned and reflowed for attachment by the end user. When the chip is attached to the board as described, the final consumption of board area is usually not much larger than the area of the chip (about 20% larger). Consequently, this family of products is classified as "chip-scale packages". However, these devices contribute little to reduce the device height, which is critical in small appliances.

An example of a solder ball flip-chip structure designed for stress absorption after mounting is described in the Japanese Patent #1-209746, issued on Aug. 23, 1989 (Moriyama Yoshifumi, "Semiconductor Device"). The perimeter of the under-bump metallization of the solder ball is supported by a polyimide layer; further, a second thick polyimide layer is shown under the bump metallization as low stress, heat tolerant resin.

Structures such as the one quoted above are based on the publication "A Silicon and Aluminum Dynamic Memory Technology" by Richard A. Larsen (IBM J. Res. Develop., vol.24, no. 3, May 1980, pp. 268–282). The article includes description of a flip-chip packaging technology using a solder bump on an under-bump metallization, which is resting its perimeter on a thick polyimide layer. The bump structure is supported by another polyimide layer.

Problems exist with conventional process equipment and flows for chip-scale packages using flip-chip technology. First, a typical solder bumping process is very equipment intensive, resulting in a large capital cost. Evaporation, plating and screening are environmentally unfriendly in that they make use of excess of solder, often containing lead. Both processing and clean-up costs are high in these operations.

Second, the manufacturing of flip-chip assembly can have a long cycle time. Typically, reflows which are carried out in infrared or forced convection ovens have cycle times of 5 minutes or longer. These furnaces are usually very long (>3 m) and massive structures, occupying much space on the assembly floor. Moving parts in such furnaces are a significant source of particulate contamination.

Third, present day assembly of flip-chips is processed in chip form. The assembly process starts after the chip has been diced from the wafer. This type of production strategy causes a disconnect between the wafer fabrication and test plant ("wafer fab") and the assembly and final test site because the dicing of the wafer must occur outside the clean room environment of a wafer fab. In addition, there are substantial costs in shipping valuable wafers worldwide. After packaging is completed in the assembly sites, the devices must undergo final testing before they can be shipped to the customer. A need thus exists for a packaging method that provides for wafer-scale assembly of integrated circuits, preferably in the clean room facility of the wafer fab itself.

SUMMARY OF THE INVENTION

The present invention describes a semiconductor chip having a planar active surface including an integrated circuit protected by an inorganic overcoat; the circuit has metallization patterns including a plurality of contact pads. Each of these contact pads has an added conductive layer on the circuit metallization. This added layer has a conformal surface adjacent the chip, including peripheral portions of the overcoat, and a planar outer surface; this outer surface is suitable to form metallurgical bonds without melting. The chip contact pads may have a distribution arrayed in the center of the chip in close proximity to the chip neutral line. The chip may further have a non-conductive adhesive layer over the overcoat, filling the spaces between the added conductive layers on each contact pad.

The inorganic overcoat is moisture-impenetrable and stiff. This overcoat may have an additional top layer of organic overcoat which is heat-resistant and compliant.

The chip contact pads may have a distribution such that an area portion of the active chip surface is available for attaching a thermally conductive plate; this plate has a thickness compatible with the thickness of the conductive pad layer.

The present invention further discloses several embodiments of semiconductor assemblies in which a chip as described above is bonded to a wiring board which has a plurality of planar, metallurgically bondable terminal pads in a distribution aligned with the distribution of the chip contact pads. The bonding is performed by a technique selected from Direct welding by metallic interdiffusion;

Attaching by solder paste;

Attaching by conductive adhesive.

In the first embodiment, the chip, with or without the heat spreader, is directly bonded to the board.

In the second embodiment, the chip, with or without heat spreader, is first attached to a substrate. In the "ball-grid array" version of this embodiment, the substrate comprises solder balls for the attachment to the wiring board. In the "land-grid-array" version of this embodiment, the device comprises bondable pads for the attachment to the wiring board.

In the third embodiment, the chip, with or without heat spreader, is first attached to a relatively thicker metal patterned in the mirror image of the chip contact pads. This thicker metal, in turn, is the directly bonded to the wiring board. For the third embodiment, as well as for the second embodiments, an encapsulation, for example in protective molding compound, of chip and substrate is preferred. This feature, in turn, provides the condition for assembling extra-thin silicon chip material, a welcome contribution for fabricating low-height chip-scale devices.

The first and the third embodiment can be designed and manufactured as true chip-size devices.

It is a technical advantage of the present invention that a wide variety of materials and techniques can be employed for the proposed metallization and assembly steps.

Other technical advantages of the present invention include a reduction of manufacturing cost, a lead-free assembly solution, improved thermal performance of the package, and improved reliability of the device.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 09/458,593, filed on Dec. 10, 1999 (Zuniga et al., "Bonding over Integrated Circuits"), and Ser. No. 10/006,576, filed on Dec. 6, 2001 (Koduri et al., "Back Side Coating of Semiconductor Wafers"). Further, the present invention is related to U.S. patent application Ser. No. 10/001,302, filed on Nov. 1, 2001 (Zuniga et al., "Bumpless Wafer-Scale Device and Board Assembly"), which is herewith incorporated by reference.

Figure 1:
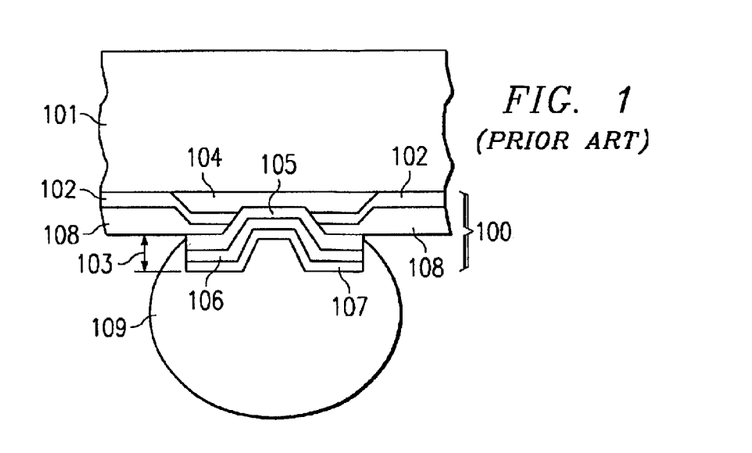
FIG. 1 is a schematic cross section of an IC contact pad having under-bump metallization and a solder ball for flip-chip attachment according to known technology.

The impact of the present invention can be most easily appreciated by highlighting the shortcomings of the known technology. As a typical example of the known technology, the schematic cross section of FIG. 1 illustrates the detail of the metallurgical requirements for the integrated circuit contact pad 100 in order to ready it for flip-chip assembly using solder balls. A semiconductor chip 101, commonly silicon, is protected by a moisture-impermeable dielectric protective overcoat 102, usually silicon nitride, an optional additional organic overcoat 108, and a patterned metallization "under-bump" 103 over the aluminum or copper 104 of the circuit contact pads. Metallization 103 usually consists of a sequence of thin layers: When the circuit metallization 104 is aluminum, the conformal layer 105 adjacent to the circuit is typically a refractory metal 105, such as chromium, titanium, tungsten, molybdenum, tantalum, or alloys thereof. When the circuit metallization 104 is copper, the conformal layer 105 is typically aluminum. The following buffer layer 106 is typically nickel. The outermost layer 107 has to be a solderable metal, such as gold, copper, nickel, or palladium.

Finally, solder bump 109 is formed by reflowing the deposited (evaporated or plated) solder alloy (typically a mixture of tin and lead, indium, or other metals). These solder bumps assume various shapes after attaching the chip to the substrate, influenced by the forces of surface tension during the reflow process. The overall process depicted in FIG. 1 is expensive, since typically ten or more process steps are involved: Sputter chromium and copper (or nickel or any of a wide selection of metals described in the literature); spin resist; bake; expose; develop; etch metal; remove resist; seed solder; evaporate or plate solder; reflow solder; flip-chip attach.

In some process flows of the known technology, a layer 108 of polymeric material (benzocyclobutene, BCB) is deposited over the silicon nitride layer 102 so that it can act as a stress-relieving buffer between the under-bump metal 103 and the solder material 109. It has been shown to be useful in preventing solder joint failures when the solder bump has to withstand thermomechanical stresses in temperature variations (see the Japanese Patent #1-209746 of 1989 and the publication by R. A. Larsen, IBM, of 1980, both cited and discussed above).

The bumped chip is then flipped so that its surface having the integrated circuit faces the assembly board, and solder-attached to that board. This assembly lends itself to the fabrication of so-called "chip-size" devices which have the same outline as the chip. Unfortunately, these devices suffer from the drawback that, in operation and temperature excursions, they are sensitive to thermomechanical stress due to the mismatch between the coefficients of thermal expansion of the semiconductor material and the substrate material.

These reliability risks, as well as the requirements for special pad metallizations, have been described in a series of detailed publications by the International Business Machines Corporation in 1969 (IBM J. Res. Develop., Vol. 13, pp. 226–296): P. A. Totta et al., SLT Device Metallurgy and its Monolithic Extension, L. F. Miller, Controlled Collapse Reflow Chip Joining, L. S. Goldmann, Geometric Optimization of Controlled Collapse Interconnections, K. C. Norris et al., Reliability of Controlled Collapse Interconnections, S. Oktay, Parametric Study of Temperature Profiles in Chips Joined by Controlled Collapse Techniques, B. S. Berry et al., Studies of the SLT Chip Terminal Metallurgy.

These investigations of the optimum height and volume of the solder joint and the expected onset of thermal fatigue and cracking showed that it is desirable to have
- a highly ductile solder;
- a high ultimate shear strength of the chip/joint and substrate/joint interfaces;
- a large value for the ratio (radius of bump-to-chip contact)/(distance to neutral point of chip).

One method aims at absorbing part of the thermomechanical stress on the solder joints by plastic material surrounding the joints and filling the gap between chip and substrate. See for instance, U.S. Pat. Nos. 6,213,347 and 6,228,680 (Thomas, "Low Stress Method and Apparatus of Underfilling Flip-Chip Electronic Devices"). However, this method is expensive, because it represents an additional process step, and it may not be welcome since the customer may have to perform the process after device attachment to the motherboard.

Another method aims at elongating the solder joint after assembly into a column with concave surface contours. However, this method is constrained by solder volume and manufacturability.

Figure 2:
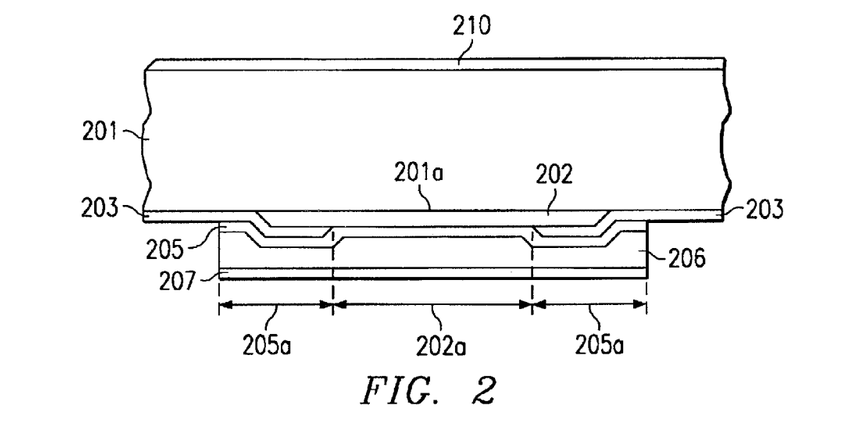
FIG. 2 is a schematic cross section of the first embodiment of the invention, showing an IC with an inorganic overcoat, the contact pad having added conductive layers, the outer layer having a planar surface suitable to form metallurgical bonds.

The schematic cross section of FIG. 2 illustrates the first preferred embodiment of the present invention. 201 is a portion of the semiconductor chip, with planar active surface 201a, including an integrated circuit (IC). The semiconductor material is commonly silicon; other materials include silicon germanium, gallium arsenide, or any other semiconductor material used in IC fabrication. The IC has a metallization pattern 202 including a plurality of contact pads 202a. The chip metallization 202 may consist of aluminum, copper, or alloys thereof. The IC surface is protected by a dielectric protective overcoat 203, usually silicon nitride or silicon oxynitride of about 1.0 µm thickness. It is impermeable to moisture and mechanically stiff. As FIG. 2 illustrates, the photoresist window defining contact pad 202a has been opened through the protective overcoat 203.

When layer 202 is aluminum or aluminum alloyed with 0.5 to 2% copper and/or 0.5 to 1% silicon (layer 0.4 to 1.5 µm thick), the contact pad exhibits under the aluminum frequently a thin layer (4 to 20 nm thick) of titanium, titanium nitride, titanium tungsten, tantalum, tantalum nitride, tantalum silicon nitride, tungsten nitride, or tungsten silicon nitride (not shown in FIG. 2).

For aluminum as well as copper chip metallization, the insulator under the metallization is typically silicon dioxide. However, with the recent trend towards dielectric materials of lower dielectric constants, films made of silicon-containing hydrogen silsesquioxane (HSQ), aerogels, organic polyimides and parylenes are also used in spite of the fact that they are less dense and mechanically weaker than previous standard insulators such as the plasma-enhanced chemical vapor deposited dielectrics. Also, stacks of dielectric layers may be used such as alternating layers of plasma-generated tetraethylorthosilicate (TEOS) oxide and HSQ, or ozone TEOS oxide and HSQ.

In order to strengthen the chip contact pad mechanically, reinforcing structures are sometimes placed under the bonding pad (not shown in FIG. 2). Descriptions may be found in U.S. Pat. No. 6,1443,396, issued Nov. 7, 2000 (Saran et al., System and Method for Reinforcing a Bond Pad), and U.S. Pat. No. 6,232,662, issued May 15, 2001 (Saran, System and Method for Bonding over Active Integrated Circuits), and U.S. patent application Ser. No. 09/312,385, filed May 14, 1999 (Saran et al., "Fine Pitch System and Method for Reinforcing Bond Pads in Semiconductor Devices").

In the embodiment of FIG. 2, the contact pad has an added conductive layer 205 on the pad metallization 202. This layer 205 is conformal to the surface of the chip and provides a reliable, low resistance contact to the pad metallization 202, as well as a strong and reliable adhesion to the inorganic overcoat 203. As FIG. 2 shows, layer 205 covers not only the area of the pad 202a proper, but also the window side walls of protective layers 203 and a portion 205a of the surface surrounding the pad window. The preferred material for layer 205 is aluminum in the thickness range of about 500 to 1000 nm. There are various methods of depositing layer 205. The preferred method is sputtering, since this method allows an effective cleaning of the pad surface just before the actual metal deposition (especially useful for aluminum pad metallization 202). Other deposition techniques include evaporating and plating.

The second added layer 206 in FIG. 2 has the important function to enable the transition from a conformal outline following the chip surface contours, to a "flat" outline defining a planar outer surface, which is substantially parallel to the chip surface. The second conductive layer 206 may also have to operate as a diffusion barrier if copper is used as the chip metallization 202. The second conductive layer is selected from a group consisting of nickel, vanadium, titanium, tungsten, tantalum, osmium, chromium, and aluminum, and alloys thereof.

Dependent on the choice of the metal, there are several methods of depositing layer 206:

Electroless plating. The complete process includes the following steps:

Coating the backside of the silicon IC wafer with resist using a spin-on technique. This coat will prevent accidental metal deposition on the wafer backside.

Baking the resist, typically at 110° C. for a time period of about 30 to 60 minutes.

Cleaning of the exposed bond pad metal surface using a plasma ashing process for about 2 minutes.

Cleaning by immersing the wafer, having the exposed metal of the bond pads, in a solution of sulfuric acid, nitric acids, or any other acid, for about 50 to 60 seconds.

Rinsing in overflow rinser for about 100 to 180 seconds.

Immersing the wafer in a catalytic metal chloride solution, such as palladium chloride, for about 40 to 80 seconds "activates" the metal surface, i.e., a layer of seed metal (such as palladium) is deposited onto the clean non-oxidized metal surface.

Rinsing in dump rinser for about 100 to 180 seconds.

Electroless plating of the barrier metal. If nickel is selected, plating between 150 to 180 seconds will deposit about 0.4 to 0.6 $\mu$m thick nickel.

More detail on this and closely related processes can be found in U.S. patent application Ser. No. 09/775,322, filed Feb. 1, 2001 (Stierman et al., "Structure and Method for Band Pads of Copper-Metallized Integrated Circuits"), which is herewith incorporated by reference.

Screen printing. A plurality of openings are prepared in a mask stencil so that their position mirror-images the position of the contact pads on the IC surface. The mask stencil is then aligned with the semiconductor wafer so that each mask opening aligns with its respective IC contact pad. The metal or metal alloy is liquefied and deposited through the mask openings so that it equalizes the overcoat contours of the pad window remaining from the etch step through the overcoat layers.

Support by islands of protective overcoat. Applying a modification of the U.S. patent application Ser. No. 09/458,593 cited above, the contact pads are opened so that a plurality of silicon nitride "islands" remain unetched in the window area, creating numerous silicon nitride "mesas" with narrow vias between them. In the following metal deposition step (for instance, aluminum as the first layer, nickel as the second layer), the vias are quickly filled, while metal is also deposited on top of the mesas. The overall window metal surface approaches progressively a uniformly flat configuration.

In FIG. 2, the outermost metal layer 207 has a surface suitable to form metallurgical bonds without melting. As an example, layer 207 is made of a metal selected from a group consisting of gold, palladium, platinum, silver, and alloys thereof. The bondability function of layer 207 is emphasized. The overall thickness of the bondable metal layer 207, usually a noble metal, is kept to a minimum, thus saving cost. Acceptable thicknesses range from about 0.02 to 0.1 $\mu$m; for some metals, a flash is sufficient.

Without necessarily resorting to melting solder, these surfaces are suitable for the following attaching methods to outside board surfaces, which have been prepared with appropriately bondable metal surfaces (typically gold flash on copper-metallized terminal pads):

Direct welding by metallic interdiffusion. For this bonding, the clean surfaces of the chip contact and board terminal pads are subjected to slight compression or thermo-compression at elevated temperatures and moderate pressures for a period of time on the order of 1 s.

Attachment by conductive adhesives. This preferred embodiment permits small pad sizes and fine pad pitch, since conductive adhesives do not tend to bridge.

Attachment by solder paste. Both the chip contact pads and the board terminal pads are solderable. Consequently, metallurgically strong solder connections are easily established.

It is an important feature of the present invention that the number of added conductive layers are not restricted to three. There may be only one layer, or two layers, or more than three layers added to the chip contact pads metallization. It is only required that the added conductive layer or layers have a conformal surface adjacent the chip and a planar outer surface, and that the outer surface be suitable to form metallurgical bonds, without necessarily resorting to melting of solder.

Figure 6A:
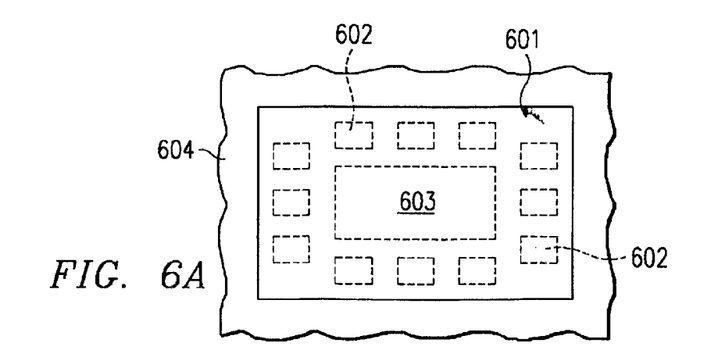
FIG. 6A is a schematic top view of the fifth embodiment of the invention showing an assembled chip active chip surface having a plurality of metallized contact pads (in a peripheral array) and a heat spreader positioned in the remaining surface area.

It is another important feature of the present invention that the described added conductive layers can be formed onto any number of chip contact pads. The described technique is thus applicable chips with a small number of I/O's (for example, 12 I/O's as illustrated in FIG. 6A) as well as to chips with a high number of I/O's (for example, 200 or 600 I/O's). The contact pads may be shaped as a rectangle, a square or a circle with a side length of about 40 to 150 $\mu$m, preferably 90 to 100 $\mu$m. The pitch between neighboring contact pads is typically in the range from 0.4 to 0.6 mm with a separation between pads from 50 to 200 $\mu$m, for chips with high numbers of input/output terminals preferably between 50 and 75 $\mu$m. It is a technical advantage of the present invention that the pitch between neighboring contacts can be reduced to 100 $\mu$m center-to-center, which is a major improvement over solder ball contacts.

It is another important feature of the present invention that the described added conductive layers can be formed whatever the arrangement and distribution of the contact pads may be. As an example, the contact pads may be arrayed along the periphery of the active chip surface, as illustrated in FIG. 6A. In another example, the contact pads may be arrayed in the center of the active chip surface, as illustrated in the schematic top view of the active chip surface in FIG. 4. In this third embodiment of the invention, the distribution of contact pads 402 on the active chip surface 401 is arrayed in the center of the chip in close proximity to the neutral line of the chip so that any stress on the contact joints after assembly is minimized. In yet another example, the contact pads may be arrayed in an arbitrary configuration across the active chip surface.

It is a technical advantage of the present invention that it permits protection of the passive surface of the chip, indicated by the layer 210 in FIG. 2. Preferably, layer 210 is an electrically non-conductive material of black color to protect the chip against disturbing influences of light or other electromagnetic radiation, of environmental degradation such as moisture and dust, and of mechanical disturbances such as scratches. Methods of fabricating layer 210 include:

Screen-printing of polymeric material, undoped or doped;

Spinning of insulating material which will harden;

Attaching tape or film;

Spraying low-viscosity material which will harden; and

Transfer molding a protective layer.

Figure 3:
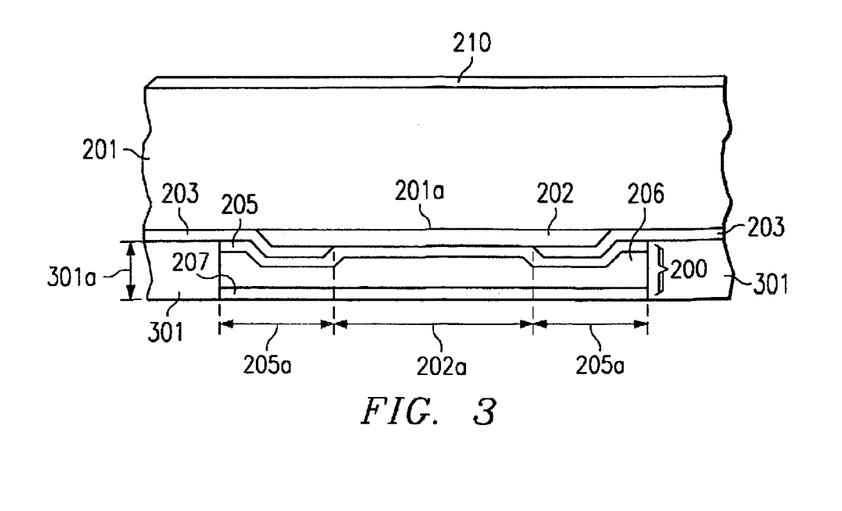
FIG. 3 is a schematic cross section of the second embodiment of the invention, showing a layer of non-conductive adhesive added to the device of FIG. 2.

FIG. 3 illustrates the second preferred embodiment of the invention in a schematic cross section analogous to FIG. 2. A non-conductive adhesive layer 301 has been deposited over the inorganic overcoat 203, adhering to overcoat 203 as well as to an outside part after chip assembly. This adhesive layer has the same height 301a as the added metallization 200 over the contact pad. In this manner, the adhesive layer 301 serves to fill the spaces between the added metallization on each of the contact pads.

Figure 5:
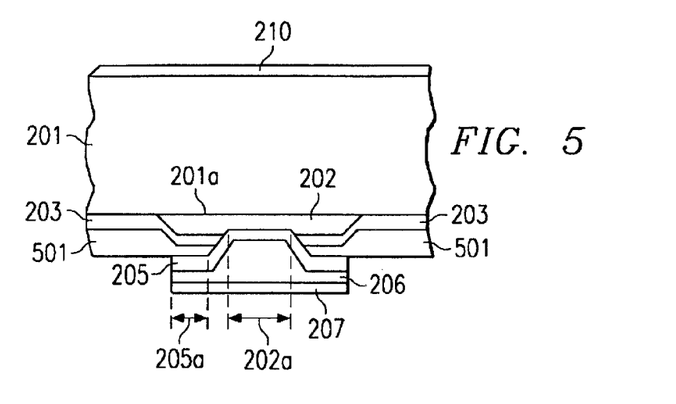
FIG. 5 is a schematic cross section of the fourth preferred embodiment of the invention, showing an IC with an inorganic and an organic overcoat, the contact pad having added conductive layers, the outer layer having a planar surface suitable to form metallurgical bonds.

FIG. 5 depicts the fourth embodiment of the invention. A polymeric layer 501 in the thickness range between 1 and 3 $\mu$m is deposited over the inorganic overcoat 203. This organic overcoat 501 is heat-resistant and mechanically compliant. It thus provides the stress-relieving buffer between the under-bump metallization and the solder material, as described in the above-cited publication by R. A. Larsen (1980). Preferred materials for layer 501 include polyimide and benzocyclobutene (BCB).

Figure 6B:
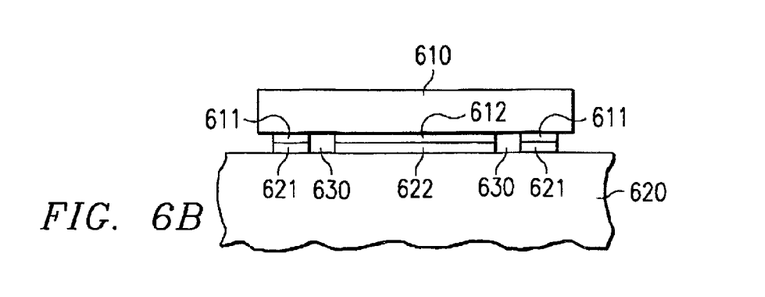
FIG. 6B is a schematic cross section of the fifth embodiment, having metallized contact pads and a heat spreader, attached to a printed circuit board.

FIGS. 6A and 6B illustrate the fifth preferred embodiment of the invention in a schematic top view (FIG. 6A) of the chip 601 after assembly, and a schematic cross section (FIG. 6B) of the chip attached to the wiring board 604. In the fifth embodiment as illustrated in FIG. 6A, the chip contact pads 602, covered with the added conductive layers as described above, are distributed such that an area portion of the active chip surface is available for attaching a thermally conductive plate 603. In the example of FIG. 6A, this area portion is the central area of the active chip surface 601. Since the plate is operable as a heat spreader, it is preferably made of a good thermal conductor (yet low cost material) such as copper and has a thickness compatible with the thickness of the added conductive pads layers (0.2 to 0.8 $\mu$m).

The plate 603 has an outer surface suitable for metallurgical bonds. Especially, the outer surface may be solderable. Preferably, the outer plate surface is a noble metal layer similar to layer 207 in FIG. 2, for instance a gold flash. The plate can then be attached to a wiring board metal pad, pre-fabricated in aligned position, concurrently with the attachment of the contact metal structures 602 to the board. For this attachment to the board, the same options are available, which are discussed above:

Direct welding by metallic interdiffusion;

Attachment by conductive adhesives;

Attachment by solder paste.

The schematic cross section of FIG. 6B depicts the assembled system. IC chip 610 has a plurality of metallized contact pads 611 arrayed along the chip periphery. Further, it has a heat-spreading plate 612 in the chip surface area not utilized by contact pads. The wiring board 620 has mirror-image counterparts: terminal pads 621 and thermal sink 622. The assembly establishes electrical contact between the IC chip and the board, and forms gaps 630 in the spaces between the metallized areas. The width of the gaps is approximately equal to the thickness of the added conductive layers 611 on the chip contact pads, plus any height of the aligned metallization 621 on the board. Gaps 630 are filled with non-conductive adhesive when chips featuring the second embodiment of the invention, as described in FIG. 3, are used.

The assembly board 620 is typically selected from a group consisting of organic materials, including FR-4, FR-5, and BT resin, with or without strengthening or thermally modulating fibers; metals; and ceramics. It is a technical advantage to fill board 620 with particles of oxidized silicon (size about 10 to 100 $\mu$m) in order to approximate the board coefficient of thermal expansion (CTE) to the silicon CTE and thus minimize the stress exerted on the contact joints due to CTE mismatch.

Figure 4:
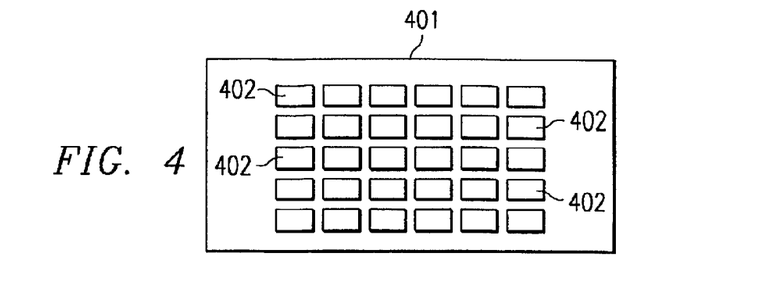
FIG. 4 is a schematic top view of the active surface of a chip according to the third embodiment of the invention, showing the contact pads arrayed in the center of the chip.
Figure 7A:
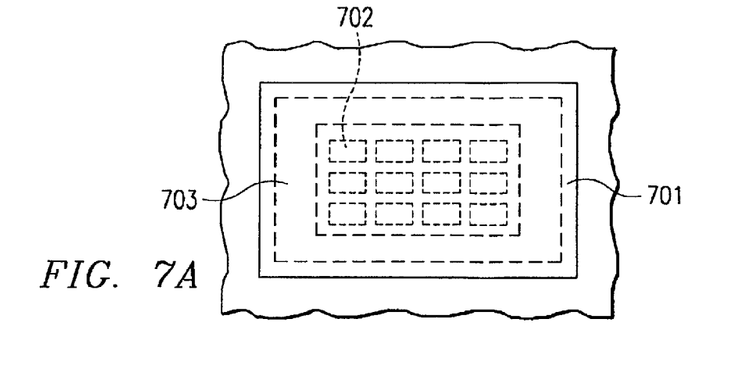
FIG. 7A is a schematic top view of a combination of the third and fifth embodiments showing the active chip surface having a plurality of metallized contact pads in a centralized array and a heat spreader positioned in the remaining surface area.
Figure 7B:
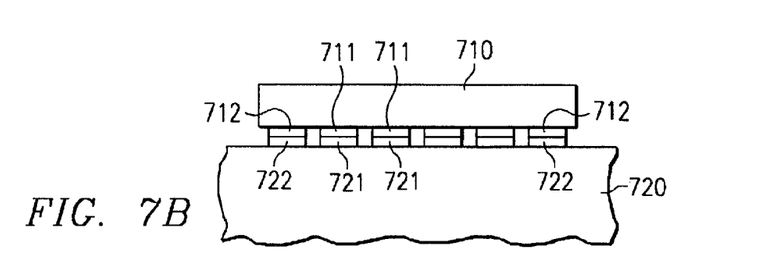
FIG. 7B is a schematic cross section of the structure of FIG. 7A, having metallized contact pads and a heat spreader, attached to a printed circuit board.

As described in the third embodiment of the invention in FIG. 4, the contact pads may be arrayed in the center of the active chip surface. This case is depicted in FIGS. 7A and 7B, with the contact pads 702 and 711, respectively, in the center of the surface 701 of chip 710. The area portion of the active chip surface available for attaching a thermally conductive plate is the chip periphery. The heat spreader is now formed as a broad frame 703 and 712, respectively, around the contact pads. This distribution is particularly favorable for minimizing thermomechanical stress at the assembled contact pads, when the system is subjected to temperature variations and the mismatch between the CTE's of IC chip and board become important. The mirror-image metallized areas on board 720 are designated 721 for the contact pads and 722 for the heat-conducting frame.

Figure 7C:
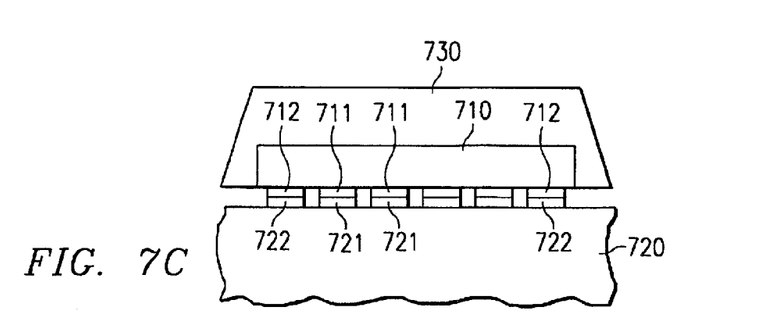
FIG. 7C is a schematic cross section of the assembly of FIG. 7B including a protective device encapsulation.

It is yet another important feature of the present invention that an encapsulation can be formed protecting at least the chip surface opposite to the active surface, and that the encapsulated device can be assembled on a board. The preferred encapsulation material is a molding compound, and the preferred encapsulation method the transfer molding technique. The device variation exhibiting a molded encapsulation is especially recommended when the I/C chip is thinner than the customary thickness of 275 $\mu$m. FIG. 7C shows the assembly of FIG. 7B with a device having an encapsulation 730.

Figure 8:
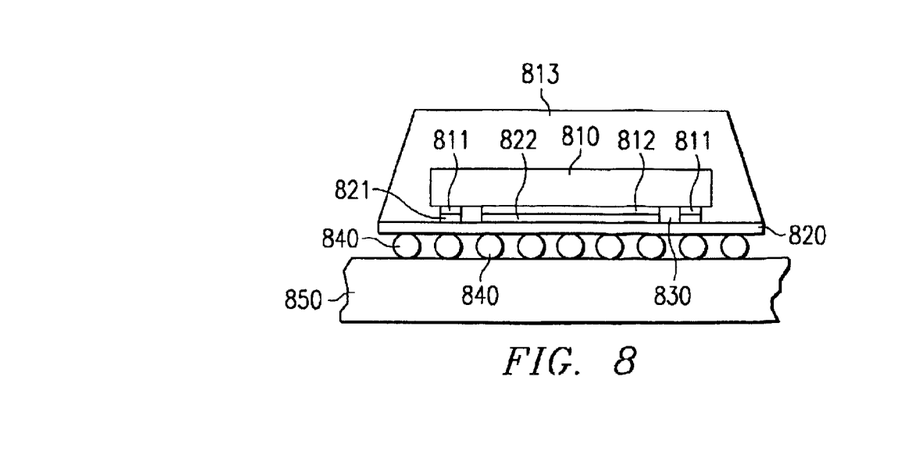
FIG. 8 is a schematic cross section of the assembly in FIG. 6B attached to an insulator-based substrate, then encapsulated in a molded package, and finally attached to a board using solder balls.
Figure 9:
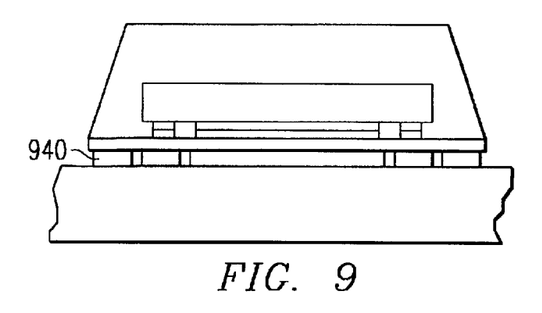
FIG. 9 is a schematic cross section of the assembly in FIG. 6B attached to an insulator-based substrate, then encapsulated in a molded package, and finally attached to a board using bondable metal lands.

In FIGS. 8 and 9, a molded device analogous to the embodiment in FIG. 6B is shown in an assembly on relatively thin substrates, preferably insulator-based substrates such as a polyimide film. In FIG. 8, this assembled device is then completed as a ball-grid array device having solder balls. In FIG. 9, the assembled device is completed as a land-grid array (lead-less, or no-lead) device having bondable or solderable attachment pads.

In the schematic cross section of FIG. 8, the I/C chip 810 has added conductive contact metallization 811 for the plurality of pads and a heat spreader 812 similar to FIG. 6B. Molding compound 813 encapsulates the device. The film-like substrate 820 has mirror-image terminals 821 for the contact pads 811 and heat sink 822 for heat spreader 811. Molding compound 813 encapsulates the passive surface of the chip, attaches strongly to substrate 820, and fills the gaps 830. Using solder balls 840, the device is attached to printed circuit board 850.

In the schematic cross section of FIG. 9, bondable or solderable lands 940 replace the solder balls 840 of FIG. 8. In other respects, the structure of the device and the assembly onto the board are analogous to FIG. 8.

Figure 10:
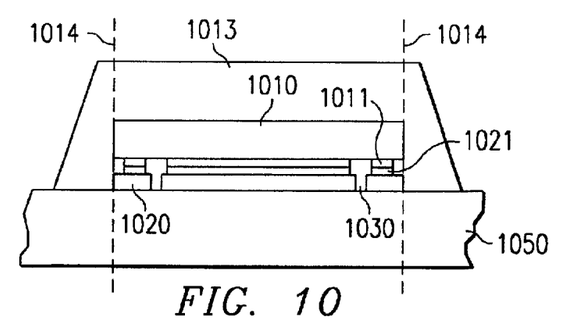
FIG. 10 is a schematic cross section of the assembly in FIG. 6B attached to a sheet-like metal, then encapsulated, and finally attached to a board using the bondable outer surface of the metal sheet.

In the embodiment of FIG. 10, the contact metallization 1011 of chip 1010 is attached to the counterparts 1021 on a "leadframe"-like, relatively thick sheet of metal 1020. This sub-assembly is encapsulated in molding compound 1013, which also fill the gaps 1030. The outer surface of the sheet-like metal 1021 is bondable or solderable. It is attached to printed circuit board 1050. It should be mentioned that the embodiment of FIG. 10 lends itself to fabricating a chip-size package. Instead of encapsulating individual chips, the whole wafer is encapsulated by molding compound. Subsequently, the devices are singulated, preferably by sawing, along lines 1014, which are determined by the outline of chip 1010.

Figure 11:
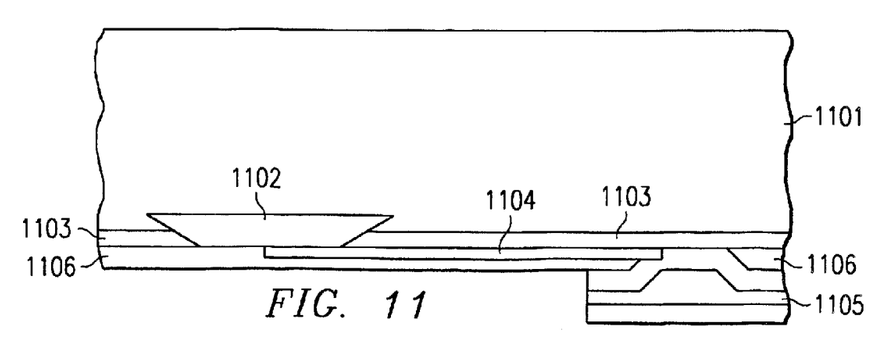
FIG. 11 shows a schematic cross section of a chip with contact pad, redistribution line, and added conductive layers for connection to other parts according to the invention.

FIG. 11 shows schematically an example for applying the contact metallization of the invention to the case where a redistribution of connecting lines from chip contact pads to remote contact pads at predetermined locations is desired. Such redistribution may often be required for connection to printed wiring boards with fixed terminals. Chip 1101 has a contact pad 1102, made of copper or aluminum, and a first protective overcoat 1103, preferably made of silicon nitride or oxynitride (or a stack of inorganic and organic layers). A metal line 1104, preferably made of copper, connects chip contact pad 1102 to the redistributed pad 1105. Pad 1105 exhibits the layer sequence and fabrication methods described above. The redistributing metal lines 1104 may be protected by another layer 1106 (or stack or organic an inorganic layers).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the mutual arrangement of the contact pads and the heat spreader may be designed in a number of different configurations. As another example, the selection of the added metal layers to the contact pads can be varied to be best suitable for the assembly technique selected for board attachment.

It is therefore intended that the appended claims encompass any such modifications or embodiments.

We claim:

1. A semiconductor device comprising:
   a semiconductor chip having a planar active surface including an integrated circuit protected by an inorganic overcoat, said circuit having metallization patterns including a plurality of contact pads, wherein the inorganic overcoat includes side walls over each of the contact pad surfaces;
   each of said contact pads having an added conductive layer on said metallization, said added layer having a conformal surface adjacent said chip, including peripheral portions of said overcoat, and a planar outer surface covering the side walls of the inorganic overcoat and defining a flat outline substantially parallel to the chip surface, said outer surface suitable to form metallurgical bonds without melting; and
   a non-conductive adhesive layer over said overcoat.

2. The device according to claim 1
   wherein the adhesive layer fills the spaces between said added conductive layers on each of said contact pads, wherein the adhesive layer is the same height as the conductive layers on each of said contact pads.

3. The device according to claim 1 further comprising:
   a distribution of said contact pads arrayed in the center of said chip in close proximity to the chip neutral line.

4. The device according to claim 1 wherein said chip metallization is aluminum, copper, or alloys thereof.

5. The device according to claim 1 wherein said conductive layer consists of at least two conductive sub-layers, one being a conductive diffusion barrier, the other, outer layer being bondable.

6. The device according to claim 1 wherein said conductive diffusion barrier is selected from a group consisting of nickel, vanadium, titanium, tungsten, tantalum, osmium, chromium, and aluminum.

7. The device according to claim 1 wherein said bondable layer is selected from a group consisting of gold, palladium, platinum, silver, and alloys thereof.

8. The device according to claim 1 wherein said outer surface has a flatness suitable for metal interdiffusion with another flat surface formed by a metal suitable for interdiffusion.

9. The device according to claim 1 wherein said inorganic overcoat is moisture impermeable and stiff.

10. The device according to claim 1 further comprising:
    a distribution of said contact pads such that an area portion of said active chip surface is available for attaching a thermally conductive plate, said plate having a thickness compatible with the thickness of said conductive pad layer.

11. The device according to claim 10 wherein said plate has an outer surface suitable for metallurgical bonds.

12. The device according to claim 10 wherein said plate surface is solderable.

13. The device according to claim 10 wherein said contact pads are arrayed along the periphery of said chip and said plate is located inside said periphery.

14. The device according to claim 10 wherein said contact pads are arrayed in the center of said chip and said plate is formed as a frame around said contact pads.

15. The device according to claim 1 wherein said semiconductor chip is made from a material selected from a group consisting of silicon, silicon germanium, gallium arsenide, and any other semiconductor material used in integrated circuit fabrication.

16. The device according to claim 1 further comprising encapsulation material protecting at least the chip surface opposite said active surface.

17. The device according to claim 16 wherein said encapsulation material is a molding compound.

18. The device according to claim 1 further comprising a metallic or insulating substrate having terminal pads aligned with the distribution of said chip contact pads, each terminal pad being bonded to one of said chip contact pads having said added layer, respectively, such that electrical contact between said chip and said substrate is established, while forming a gap therebetween having a width of approximately said added layer thickness.

19. The bonding according to claim 18 wherein said bonding is selected from a group of techniques and materials comprising:
    direct welding by metallic interdiffusion;
    attachment by solder paste; and
    attachment by conductive adhesive.

20. The device according to claim 18 further comprising encapsulation material protecting at least the chip surface opposite said active surface and filling said gaps.

21. The device according to claim 18 further comprising a substrate addition suitable for attaching said device to a board, said addition selected from a group consisting of solder balls, conductive lands, and bondable surface finish.

22. The device according to claim 1 further comprising a protective layer on the chip surface opposite said active surface, said protective layer shielding against light and disturbing environmental influences.

23. The device according to claim 22 wherein said protective layer comprises hardened polymeric material.

24. The device according to claim 2 wherein the side walls are window side walls.

* * * * *